United States Patent [19]
Whitson et al.

[11] Patent Number: 5,702,254
[45] Date of Patent: Dec. 30, 1997

[54] COMBINATION RECEPTACLE FOR INTERCHANGEABLE LAMPS IN CIRCUIT BOARDS

[75] Inventors: Duane Eugene Whitson, Amboy; Michael Joseph O'Connor; Curtis Allen Stapert, both of Kokomo, all of Ind.

[73] Assignee: Delco Electronics Corporation, Kokomo, Ind.

[21] Appl. No.: 783,839

[22] Filed: Jan. 13, 1997

[51] Int. Cl.⁶ .................................................. H01R 9/09
[52] U.S. Cl. ................................................. 439/57; 439/168
[58] Field of Search .............................. 439/56, 57, 168, 439/220, 516

[56] References Cited

FOREIGN PATENT DOCUMENTS

| | | | |
|---|---|---|---|
| 1117748 | 11/1961 | Germany | 439/220 |
| 0800059 | 8/1958 | United Kingdom | 439/220 |

*Primary Examiner*—Neil Abrams
*Assistant Examiner*—Barry Matthew L. Standig
*Attorney, Agent, or Firm*—Jimmy L. Funke

[57] ABSTRACT

A circuit board has a socket opening for a twist-in lamp bordered by a pair of arcuate conductors. The circuit board is configured to define a socket for a bi-pin lamp located concentrically within the opening and supported by bridges across the opening. The bridges carry conductors for the bi-pin lamp. The bridges are frangible to allow the socket for the bi-pin lamp to be removed. When a bi-pin lamp fails in service it is removed along with its socket and a twist-in lamp is installed in the remaining socket.

8 Claims, 2 Drawing Sheets

COMBINATION RECEPTACLE FOR INTERCHANGEABLE LAMPS IN CIRCUIT BOARDS

FIELD OF THE INVENTION

This invention relates to lamp sockets in circuit boards and particularly to sockets capable of receiving a replacement lamp of a different type than an original lamp.

BACKGROUND OF THE INVENTION

In automotive instrument clusters illumination is afforded by lamps secured to a circuit board. The two main types of lamps used for this purpose are bi-pin lamps and neo-wedge or twist-in lamps.

FIG. 1 shows the bi-pin lamp 10 which has a bulb 12 with a base 14 and a pair of terminal pins 16 extending from the base. A receptacle 18 in a circuit board 19, shown in FIG. 1a comprises a pair of holes 20 for receiving the pins 16 and conductive circuit paths 22 lead to each hole 20 to supply power to the lamp. Typically the pins 16 are joined to the paths 22 by solder joints. Such lamps are popular because they are very reliable, they are less expensive and are easier to assemble to the board than twist-in lamps. On the other hand, in the event of lamp failure, the lamp must be unsoldered to remove and the replacement soldered in place. This implies the cluster must be disassembled to allow those operations.

FIG. 2 shows the neo-wedge or twist-in lamp 24. The lamp has a bulb 26, a cylindrical base 28, and a wide bottom flange 30 on the base. Metal contacts 32 are on the top surface of the flange 30 and a pair of ears 34 extend outward from opposite sides of the base and are spaced from the upper surface of the flange 30. As shown in FIG. 2a, a receptacle 36 in a circuit board 38 comprises a circular hole 40 sized to receive the base 28 with oppositely located keyways 42 to allow insertion of the ears 34. A pair of arcuate conductors 44 on the circuit board 38 border the circular hole 40 and are connected to circuit paths 46. The lamp is inserted in the hole 40 and twisted so that the metal contacts 32 engage the conductors 44 and the flange 30 presses against the opposite side of the board to hold the lamp in place. While the twist-in lamps are easily removed and replaced, they are more expensive than the bi-pin lamps and require more time to assemble to the circuit board.

SUMMARY OF THE INVENTION

It is therefore an object of the invention to secure the economic and assembly advantages of bi-pin lamps and to provide for easy lamp replacement as well. Another object is to accommodate both bi-pin and twist-in lamps at the same location on a circuit board.

The invention is carried out by a combination receptacle employing a bi-pin receptacle within the hole of a twist-in receptacle and fastened by integral bridges to the circuit board which carry conductors to the pin contacts. The bridges are frangible so that the bi-pin receptacle can be removed from the board by breaking the bridges. Bi-pin lamps are initially installed in the circuit board and in case of failure the bi-pin lamp and receptacle are removed together and a twist-in lamp is inserted in its place.

BRIEF DESCRIPTION OF THE DRAWINGS

The above and other advantages of the invention will become more apparent from the following description taken in conjunction with the accompanying drawings wherein like references refer to like parts and wherein.

DESCRIPTION OF THE INVENTION

Figure 1:
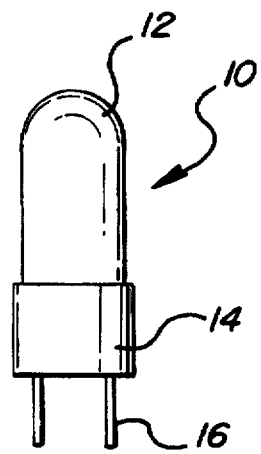
FIG. 1 is an elevation of a bi-pin lamp according to the prior art.
Figure 1A:
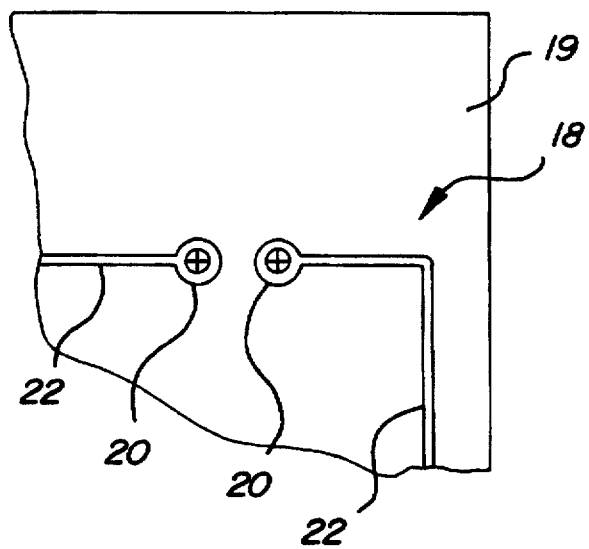
FIG. 1a is a plan view of a circuit board having a bi-pin receptacle according to the prior art.
Figure 2:
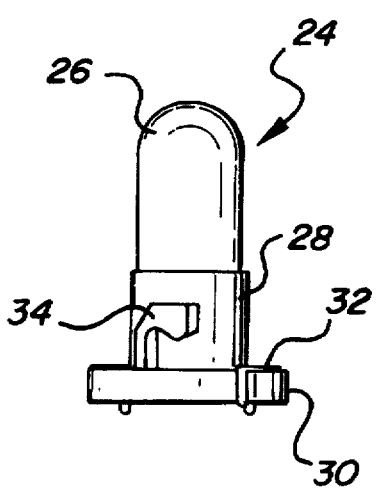
FIG. 2 is an elevation of a twist-in lamp according to the prior art.
Figure 2A:
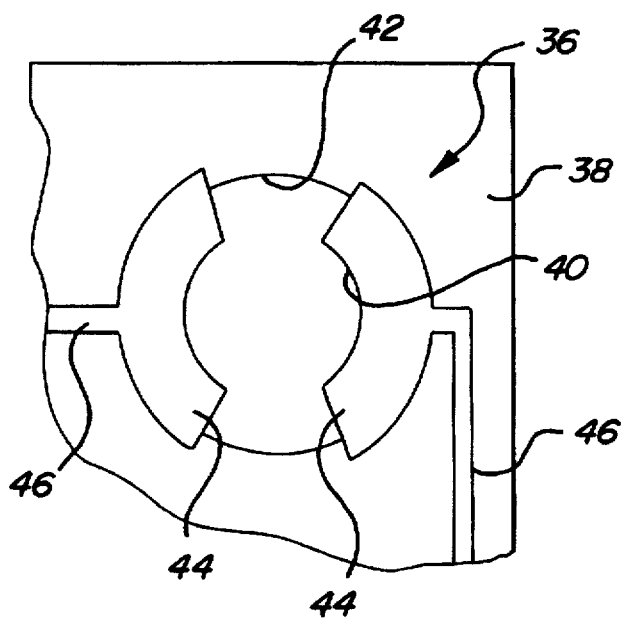
FIG. 2a is a plan view of a circuit board having a twist-in receptacle according to the prior art.
Figure 3:
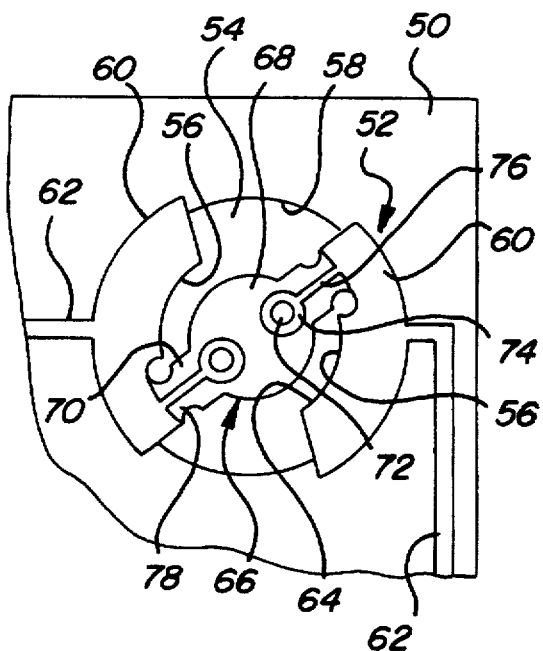
FIG. 3 is a plan view of a circuit board having a combination receptacle according to the invention.

Referring to FIG. 3, a circuit board 50 for an instrument cluster contains a combination receptacle or socket 52 which accepts a bi-pin lamp, and if a portion of the structure is removed, it will accept a neo-wedge or twist-in lamp. The combination receptacle 52 comprises an opening 54 having a pair of opposed arcuate edges 56 sized to receive a twist-in lamp 24 and spaced by keyways 58 to accommodate the ears 24 of the lamp. Arcuate contacts 60 bordering the edges 56 are connected to circuit paths 62 and supply power to the twist-in lamp contacts, thereby defining a twist-in receptacle 64.

A bi-pin receptacle 66 is located concentrically within the twist-in receptacle 64 and includes a portion 68 of the circuit board having bridges 70 connected to each edge 56 at a place adjacent a keyway 58. A pair of holes 72 to receive pins of a bi-pin lamp are surrounded by conductive contacts 74 joined to the arcuate conductors 60 by paths 76 on the bridges 70. Each bridge has reduced width at its juncture with an edge 56 to create a frangible or break-away neck 78. It is desirable that the neck be sufficiently far from the receptacle center to ensure that after removal of the bi-pin receptacle there is sufficient diametrical clearance for installation of a twist-in lamp.

Figure 4:
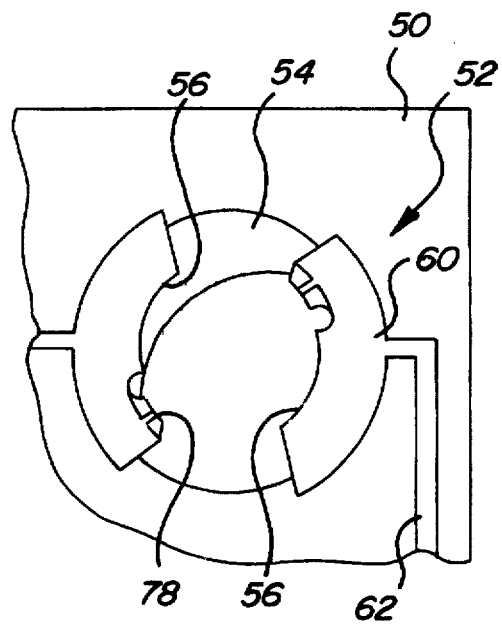
FIG. 4 is plan view of a circuit board having a combination receptacle of FIG. 3 with the bi-pin receptacle removed.

In use, the instrument cluster is fitted with bi-pin lamps upon manufacture, the lamp pins being soldered to the receptacle contacts 74. In the event of a lamp failure during service in a vehicle, the lamp is replaced by inserting a tool into the circuit board to remove the bi-pin receptacle 66 along with the bi-pin lamp. This results in an unobstructed twist-in receptacle 64 as shown in FIG. 4. A twist-in lamp is then installed to complete the repair. Due to the frangible necks 78 the removal is accomplished by prying the receptacle 66 with a screwdriver or other tool to break out the bi-pin receptacle; alternatively, a cutting tool may be used to sever the necks. It is preferred that the instrument cluster back cover have access holes to service the lamps so that cluster disassembly is not needed to replace the lamps.

Figure 5:
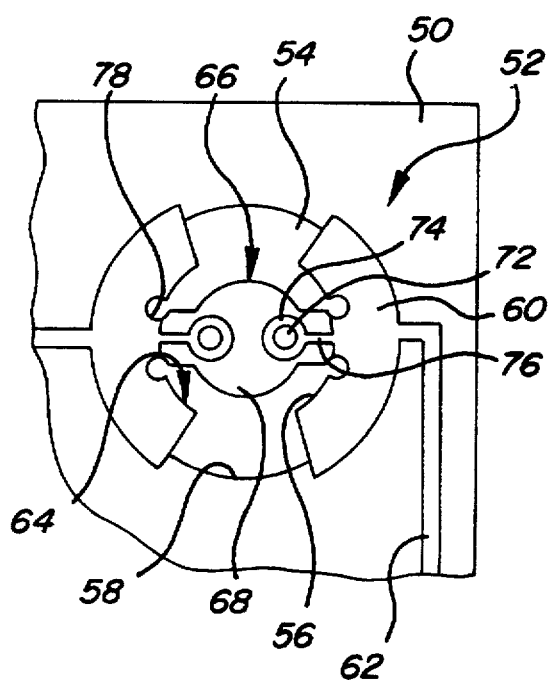
FIG. 5 is a plan view of a circuit board having a combination receptacle according to another embodiment of the invention.
Figure 6:
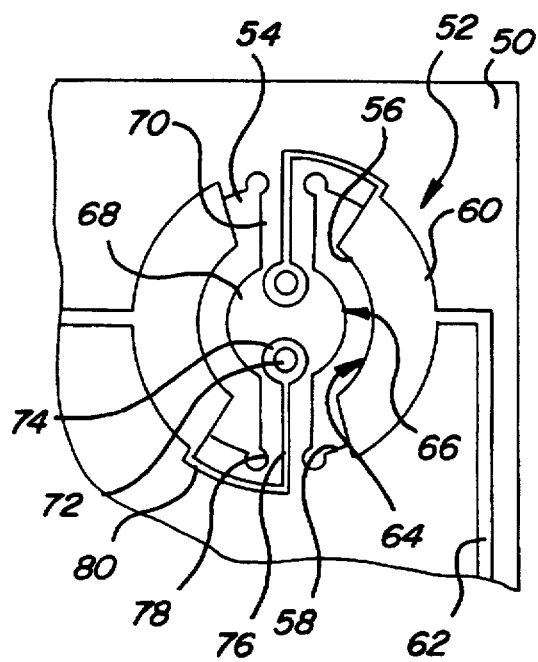
FIG. 6 is a plan view of a circuit board having a combination receptacle according to still another embodiment of the invention.

FIGS. 5 and 6 show alternative receptacle structures to accomplish the same goal. They are like FIG. 4 except for the location of the bridge juncture with the circuit board. In FIG. 5 the bridges 70 connect to the arcuate edges at the centers of the edges. In the FIG. 6 embodiment the bridges connect to the circuit board 50 at the keyways 58, and the paths 76 have extensions 80 to connect the contacts 74 to the arcuate contacts 60. In each case, the reduced necks 78 of the bridges are located to effect parting at locations which will not interfere with the installation of a twist-in lamp.

The combination receptacle is suitable for a variety of circuit board types and lamp sizes. As one example, the circuit board comprises a conventional FR-4 fiberglass material 0.062 inch thick. The diameter across the arcuate edges 56 is 6 mm, the diameter across the keyways is 9.1 mm, the spacing of the pin holes 72 is 2.54 mm, the width of each bridge is 1.78 mm, and the width at each neck is 1.2 mm.

It will thus be seen that the combination receptacle is easy and inexpensive to implement, requiring mainly a change of tooling to punch out the circuit board configuration. The invention permits the economies and reliability of the bi-pin lamps to be retained and at the same time avoids the difficulty of replacing bi-pin lamps.

The embodiments of the invention in which an exclusive property or privilege is claimed are defined as follows:

1. A combination lamp receptacle which permits initial installation of a first type of lamp and replacement by another type of lamp in a circuit board comprising:

a first receptacle concentrically positioned within a second receptacle so that the first receptacle interferes with the second receptacle until the first receptacle is removed;

the first receptacle being supported within the second receptacle by circuit board bridge means, the bridge means being subject to breaking for removal of the first receptacle;

each receptacle having conductive contacts coupled to conductors on the circuit board.

2. The invention as defined in claim 1 wherein:

the first receptacle comprises means for receiving a bi-pin lamp; and the second receptacle comprises means for receiving a twist-in lamp.

3. The invention as defined in claim 1 wherein the first receptacle contains a pair of holes associated with the conductive contacts for receiving terminals of a bi-pin lamp.

4. The invention as defined in claim 1 including circuit paths extending across the bridge means for supplying power to the conductive contacts of first lamp receptacle.

5. The invention as defined in claim 1 wherein:

the second receptacle comprises an opening defined by arcuate edges to receive a base of a twist-in lamp and by two opposed keyways for receiving ears of the twist-in lamp; and the conductive contacts of the second receptacle comprises arcuate conductors bordering the arcuate edges for engaging contact pads on the twist-in lamp.

6. The invention as defined in claim 1 wherein:

the second receptacle comprises an opening for receiving a twist-in lamp;

the conductive contacts of the second receptacle comprises arcuate conductors bordering the opening; and the bridge means is aligned with the arcuate conductors, and the conductive contacts of the first receptacle are connected to the arcuate conductors by circuit paths over the bridge means.

7. The invention as defined in claim 1 wherein:

the second receptacle comprises an opening defined by arcuate edges to receive a base of a twist-in lamp and by two opposed keyways for receiving ears of the twist-in lamp;

the conductive contacts of the second receptacle comprises arcuate conductors bordering the arcuate edges for engaging contact pads on the twist-in lamp; and the bridge means connects to the arcuate edges at sites adjacent the keyways, and the conductive contacts of the first receptacle are connected to the arcuate conductors by circuit paths over the bridge means.

8. The invention as defined in claim 1 wherein:

the second receptacle comprises an opening defined by arcuate edges to receive a base of a twist-in lamp and by two opposed keyways for receiving ears of the twist-in lamp;

the conductive contacts of the second receptacle comprises arcuate conductors bordering the arcuate edges for engaging contact pads on the twist-in lamp; and the bridge means connects to the circuit board at the keyways and between the arcuate edges, and the conductive contacts of the first receptacle are connected to the arcuate conductors by circuit paths over the bridge means.

* * * * *